United States Patent
Dolan et al.

(10) Patent No.: US 9,409,343 B2
(45) Date of Patent: Aug. 9, 2016

(54) PROCESS AND STRUCTURE TO UNCURL EMBOSSED THIN FLEX CIRCUITS

(71) Applicant: XEROX CORPORATION, Norwalk, CT (US)

(72) Inventors: Bryan R. Dolan, Rochester, NY (US); Michael Leo, Penfield, NY (US)

(73) Assignee: XEROX CORPORATION, Norwalk, CT (US)

( * ) Notice: Subject to any disclaimer, the term of this patent is extended or adjusted under 35 U.S.C. 154(b) by 578 days.

(21) Appl. No.: 13/755,631

(22) Filed: Jan. 31, 2013

(65) Prior Publication Data

US 2014/0210123 A1 Jul. 31, 2014

(51) Int. Cl.
| | |
|---|---|
| B29C 53/18 | (2006.01) |
| H05K 1/11 | (2006.01) |
| B29L 31/34 | (2006.01) |
| H05K 3/00 | (2006.01) |

(52) U.S. Cl.
CPC .............. *B29C 53/18* (2013.01); *H05K 1/118* (2013.01); *B29L 2031/3425* (2013.01); *H05K 3/0044* (2013.01); *H05K 2203/0195* (2013.01); *H05K 2203/302* (2013.01)

(58) Field of Classification Search
CPC B29C 53/18; B29L 2031/3425; H05K 1/118; H05K 2203/0195; H05K 2203/302; H05K 3/0044

USPC .................................. 264/296, 104
See application file for complete search history.

(56) References Cited

PUBLICATIONS

Stephens et al., "Electrical Interconnect Using Embossed Contacts on a Flex Circuit", U.S. Appl. No. 12/795,605, filed Jun. 7, 2010.
Bryan R. Dolan at al., "Method for Flex Circuit Bonding Without Solder Mask for High Density Electrical Interconnect", US Application Serial No., filed May 16, 2012.
Peter J. Nystrom et al., "High Density Electrical Interconnect for Printing Devices Using Flex Circuits and Dielectric Underfill", U.S. Appl. No. 13/097,182, filed Apr. 29, 2011.
Bryan R. Dolan et al., "In Situ Flexible Circuit Embossing to Form an Electrical Interconnect", U.S. Appl. No. 13/232,465, filed Sep. 14, 2011.
Peter J. Nystrom et al., "Structure and Method to Fabricate Tooling for Bumping Thin Fex Circuits", U.S. Appl. No. 13/721,896, filed Dec. 20, 2012.

*Primary Examiner* — Robert J Grun
(74) *Attorney, Agent, or Firm* — MH2 Technology Law Group LLP

(57) ABSTRACT

A method and structure for flattening or straightening a curled flexible printed circuit, such as a flexible printed circuit that has been curled during a contact embossing process. The structure can include a cylindrical opening and a support shaft suspended within the cylindrical opening that prevents buckling of the flexible printed circuit during straightening. To flatten the curled flexible printed circuit, the curled end of the flexible printed circuit can be inserted into the cylindrical opening until the curled end is wrapped partially or completely around the support shaft.

6 Claims, 3 Drawing Sheets

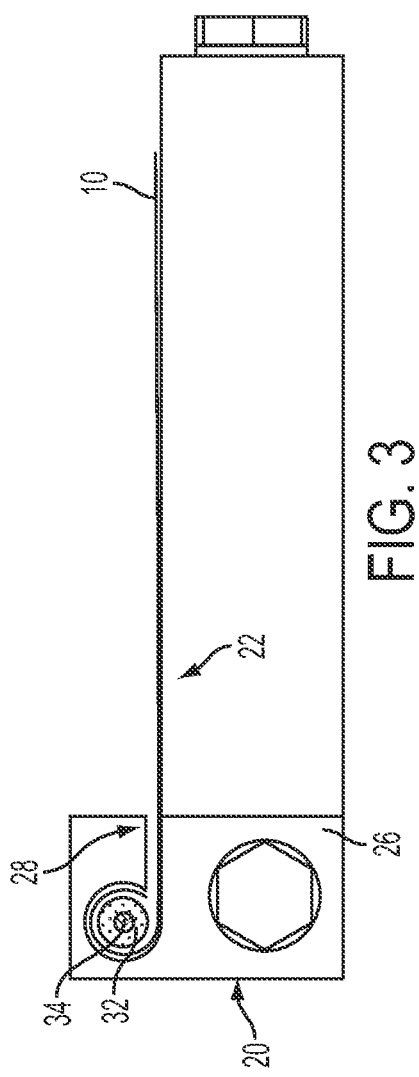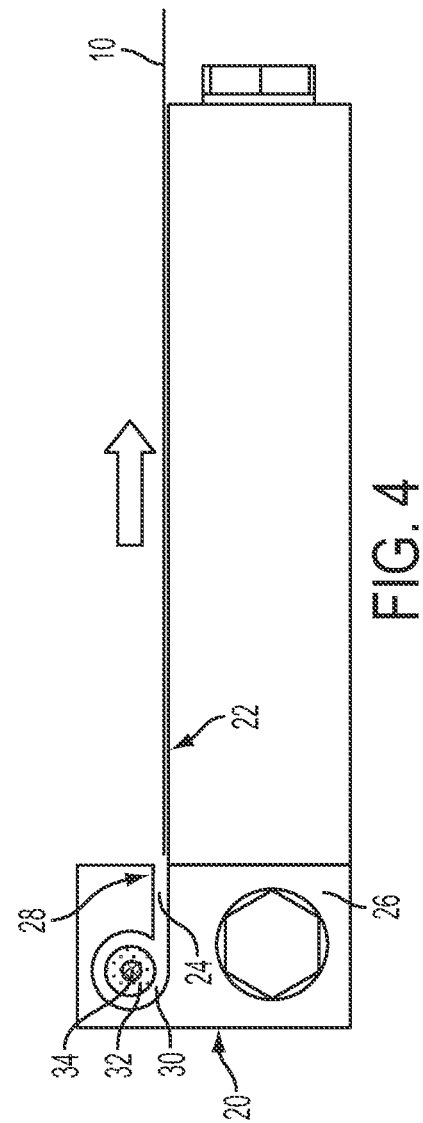

PROCESS AND STRUCTURE TO UNCURL EMBOSSED THIN FLEX CIRCUITS

FIELD OF THE EMBODIMENTS

The present teachings relate to the field of ink jet printing devices and, more particularly, to the formation of electrical connections to a plurality of conductors such as piezoelectric elements.

BACKGROUND OF THE EMBODIMENTS

Drop on demand ink jet technology is widely used in the printing industry. Printers using drop on demand ink jet technology can use either thermal ink jet technology or piezoelectric technology. Even though they are more expensive to manufacture than thermal ink jets, piezoelectric ink jets are generally favored as they can use a wider variety of inks and eliminate problems with kogation.

Piezoelectric ink jet printheads typically include a flexible diaphragm and an array of piezoelectric elements (transducers) attached to the diaphragm. When a voltage is applied to a piezoelectric element, typically through electrical connection with an electrode electrically coupled to a voltage source using, for example, a flexible printed circuit (i.e., a flex circuit), the piezoelectric element bends or deflects, causing the diaphragm to flex which expels a quantity of ink from a chamber through a nozzle. The flexing further draws ink into the chamber from a main ink reservoir through an opening to replace the expelled ink.

One method for attaching a flex circuit to an array of piezoelectric elements is to emboss electrical contacts of the flex circuit and to use the flex circuit in conjunction with a patterned standoff adhesive, where openings in the standoff adhesive expose the top of each piezoelectric element. The embossed metal contacts of the flex circuit then make electrical contact with each element of the piezoelectric array.

As resolution and density of printheads increase, the area available to provide electrical interconnects decreases. Routing of other functions within the head, such as ink feed structures, compete for this reduced space and place restrictions on the types of materials used. Methods and structures for manufacturing a flex circuit that has a better form for connection to a piezoelectric element array would be desirable.

SUMMARY OF THE EMBODIMENTS

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

In an embodiment of the present teachings, a method for forming a flexible printed circuit can include inserting a curled end of a flexible printed circuit into a cylindrical opening that is defined by a wall within a block, and extracting the flexible printed circuit from the cylindrical opening wherein, subsequent to extraction, the curled end of the flexible printed circuit is flattened.

In another embodiment, a fixture for manufacturing a flexible printed circuit can include a block comprising a cylindrical opening therein, wherein the cylindrical opening is defined by a wall of the block and the cylindrical opening is configured, upon insertion of a flexible printed circuit that comprises a curl in a first direction, to bend the flexible printed circuit in a second direction that is opposite to the first direction such that upon extraction of the flexible printed circuit from the cylindrical opening, the flexible printed circuit is flattened.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures:

FIGS. 2-4 are cross sections depicting a method and structure for straightening or flattening a curled flexible printed circuit.

Figure 1:
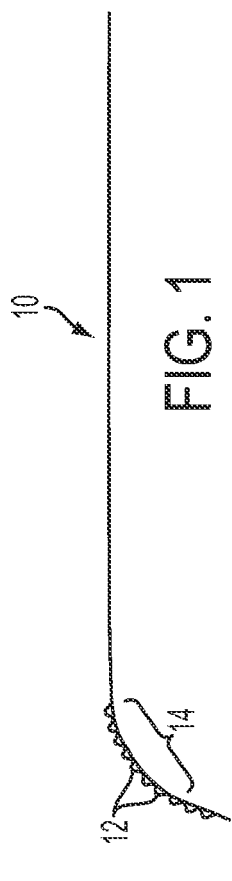
FIG. 1 is a cross section of a curled flexible printed circuit that can be used, for example, to electrically couple to a piezoelectric element array in a printhead for an ink jet printer.

It should be noted that some details of the FIGS. have been simplified and are drawn to facilitate understanding of the present teachings rather than to maintain strict structural accuracy, detail, and scale.

DESCRIPTION OF THE EMBODIMENTS

Reference will now be made in detail to exemplary embodiments of the present teachings, examples of which are illustrated in the accompanying drawings. Wherever possible, the same reference numbers will be used throughout the drawings to refer to the same or like parts.

As used herein, unless otherwise specified, the word "printer" encompasses any apparatus that performs a print outputting function for any purpose, such as a digital copier, bookmaking machine, facsimile machine, a multi-function machine, electrostatographic device, etc.

Achieving reliable electrical connections (electrical interconnects) between piezoelectric elements (PZTs) and a circuit layer such as a printed circuit board (PCB) or flexible printed circuit (flex circuit) becomes more challenging at increasing printhead resolutions. Design constraints that require dimensionally smaller PZTs reduce both the surface area available for forming an electrical interconnect as well as the area for its surrounding bond adhesive. The opening within a standoff layer for connection of a circuit layer to a PZT is reduced as PZT density in a PZT array is increased. Similarly, the effective bond area between the PZT and the circuit layer is also reduced with increasing print resolutions. This reduction in bond area can result in weaker electrical interconnects that may fail after stressing due, for example, to thermal cycling, thermal aging, and PZT actuations.

Flexible printed circuits (i.e., flex circuits) including a plurality of embossed bumps, and methods for forming the embossed bumps, have been the subject of patent applications commonly assigned with the present assignee. For example, embossed flex circuit contacts and their formation are discussed in U.S. patent application Ser. No. 12/795,605 "Electrical Interconnect Using Embossed Contacts On A Flex Circuit," Ser. No. 13/097,182 "High Density Electrical Interconnect for Printing Devices Using Flex Circuits and Dielectric Underfill," Ser. No. 13/232,465 "In situ Flexible Circuit Embossing To Form an Electrical Interconnect," and Ser. No. 13/721,896 "Structure and Method to Fabricate Tooling for Bumping Thin Flex Circuits," each of which is incorporated by reference in its entirety.

Forming embossed flex circuit contacts can include the use of a post plate having a plurality of posts and a die having a plurality of openings. The flex circuit with a plurality of unembossed (i.e., unbumped or flat) contact pads is placed between the post plate and the die. The plurality of contact pads on the flex circuit is aligned with the posts and die openings, and pressure is applied between the post plate and die such that the contact pads are forced into the openings by the posts. Because the contact pads are metal they maintain their deformed shape to provide a plurality of embossed contact pads of a bumped flex circuit.

The formation of embossed contacts can result in a flex circuit that has an undesirable curl. Without being bound by any specific theory, the bumping process may generate internal stresses within the thin flex circuit resulting from the stretching or deformation of the metal that cause it to curl. FIG. 1 is a cross section depicting a bumped flex circuit 10 after embossing contacts 12, where the embossing process results in a curl 14 within the flex circuit 10. This curl 14 increases the difficulty of alignment and bonding of the flex circuit 10 to a piezoelectric array, for example bonding to a standoff layer. When using an adhesive to physically bond the flex circuit 10 to a piezoelectric array, the curl 14 urges the flex circuit 10 away from the piezoelectric array and the adhesive, and temporary adhesion of the flex circuit to the piezoelectric array may be necessary to transfer the assembly to a lamination press for bonding, thereby increasing manufacturing complexity.

Figure 2:
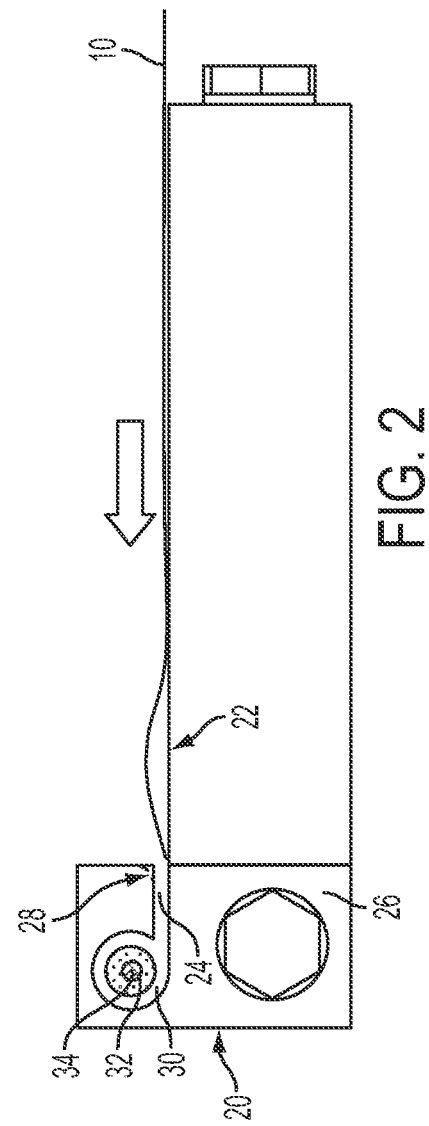

FIG. 2 depicts a device, tool, or fixture 20 for uncurling the flex circuit 10 of FIG. 1 subsequent to embossing the contacts 12 (not depicted in FIGS. 2-4 for simplicity). The contacts 12 can be embossed using, for example, a post plate and die or other embossing techniques that may result in curling of the flex circuit along at least one edge or end. In another embodiment, the flex circuit 10 is curled along at least one edge or end as a result of some other manufacturing step. The fixture 20 of FIG. 2 can include a surface or bed 22, for example a flat surface as depicted, along which the flex circuit 10 is introduced into a slot 24 in a block 26, for example a block of metal, plastic, polymer, etc. The slot 24 can include a lip 28 having an angle of about 90° as depicted, or the lip 28 can be rounded as illustrated by the dotted line to reduce possible damage of the embossed contacts 12 on an upper surface of the flex circuit 10.

The slot 24 within the block 26 of the fixture 20 leads into, and is integral with, a cylindrical opening 30. Walls of the block 26 define the cylindrical opening 30. The slot 24 and cylindrical opening 30 are of a sufficient width in the X-direction to receive the curled end of the flex circuit 10. An optional support shaft 32, such as a cylindrical support shaft, within the cylindrical opening 30 may prevent buckling of the flex circuit 10 into the center of the cylindrical opening 30 as the flex circuit 10 is advanced into the cylindrical opening 30. The support shaft 32 can be affixed at either end to a pair of plates (not individually depicted for simplicity), with each plate being attached to one of the ends of the support shaft 32 and to the block 26, for example with a pin or bolt 34, such that the support shaft 32 is suspended between the plates and centered within the cylindrical opening 32. The support shaft 32 can include a polished surface reduce or eliminate damage to the flex circuit 10 during flattening, specifically to the embossed contacts 12 as they physically contact the support shaft 32 during flattening of the flex circuit 10. Further, the inner surface of the cylinder 30 may be machined to remove burrs that may otherwise obstruct the flex circuit 10 as it is inserted into the cylindrical opening 30 for uncurling. The support shaft 32 is spaced from the wall of the block 26 that forms and defines the cylindrical opening 30 by a distance sufficient to provide clearance for the thickness of the flex circuit 10, including the embossed contacts 12. In other words, the distance between the support shaft 32 and the wall of the block 26 that forms the cylindrical opening 30 is at least as large as, or larger than, the thickness of the flex circuit 10 including the contacts 12.

To flatten the curl 14 in the flex circuit 10, the flex circuit 10 is placed on the bed 22 with the contacts 12 facing up and the curled end toward the slot 24 in the block 26. The flex circuit 10 is slid along the bed 22 toward the slot 24 such that the curled end of the flex circuit 10 is inserted into the slot 24 and slides along the wall of the cylindrical opening 30 as depicted in FIG. 3. The flex circuit 10 is inserted into the cylindrical opening 30 for a sufficient distance that the curled portion of the flex circuit 10 bends or flexes in the opposite direction from the curl 14 depicted in FIG. 1. The flex circuit 10 may extend around the support shaft 32 without physically touching the support shaft 32 as depicted in FIG. 3. In another embodiment, the flex circuit 10 may physically contact the support shaft 32 if forces exerted on the flex circuit 10 during insertion cause the flex circuit 10 to buckle, in which case the support shaft 32 prevents buckling and collapse of the flex circuit 10 into the cylindrical opening 30. Subsequently, the flex circuit 10 is slid in the opposite direction along the bed 22 as depicted in FIG. 4 to extract or remove the flattened flex circuit 10 from the cylindrical opening 30 as depicted. Subsequent to extracting the flexible circuit, the curl 14 is reduced, removed, or eliminated from the flex circuit 10, and the flex circuit 10 is thereby flattened.

After forming the flattened flex circuit 10, one or more flex circuits can be assembled along with a piezoelectric element array to form a printhead such as an ink jet printhead.

In use, an operator may manually insert the flex circuit 10 into the slot 24 and the cylindrical opening 30, and may extract the flex circuit 10 from the cylindrical opening 30 and slot 24 manually. A manual process would be particularly suited for low volume runs. In another embodiment, each flex circuit 10 can be inserted into, and extracted from, the slot 24 and the cylindrical opening 30 within the fixture 20 using an automated process. An automated process would be particularly suited for high volume production runs.

It will be apparent that a flex circuit can be undesirably curled as a result of various manufacturing processes other than contact embossing. An embodiment of the present teachings can be tailored to flatten different types of flex circuit that have been curled as a result of any number of manufacturing processes. Embodiments of the present teachings can thus provide an approach for uncurling a flex circuit for compatibility with the subsequent alignment and bonding steps. Flattening of the flex circuit 10 is performed without damaging the embossed contacts or bumps 12.

Figure 5:
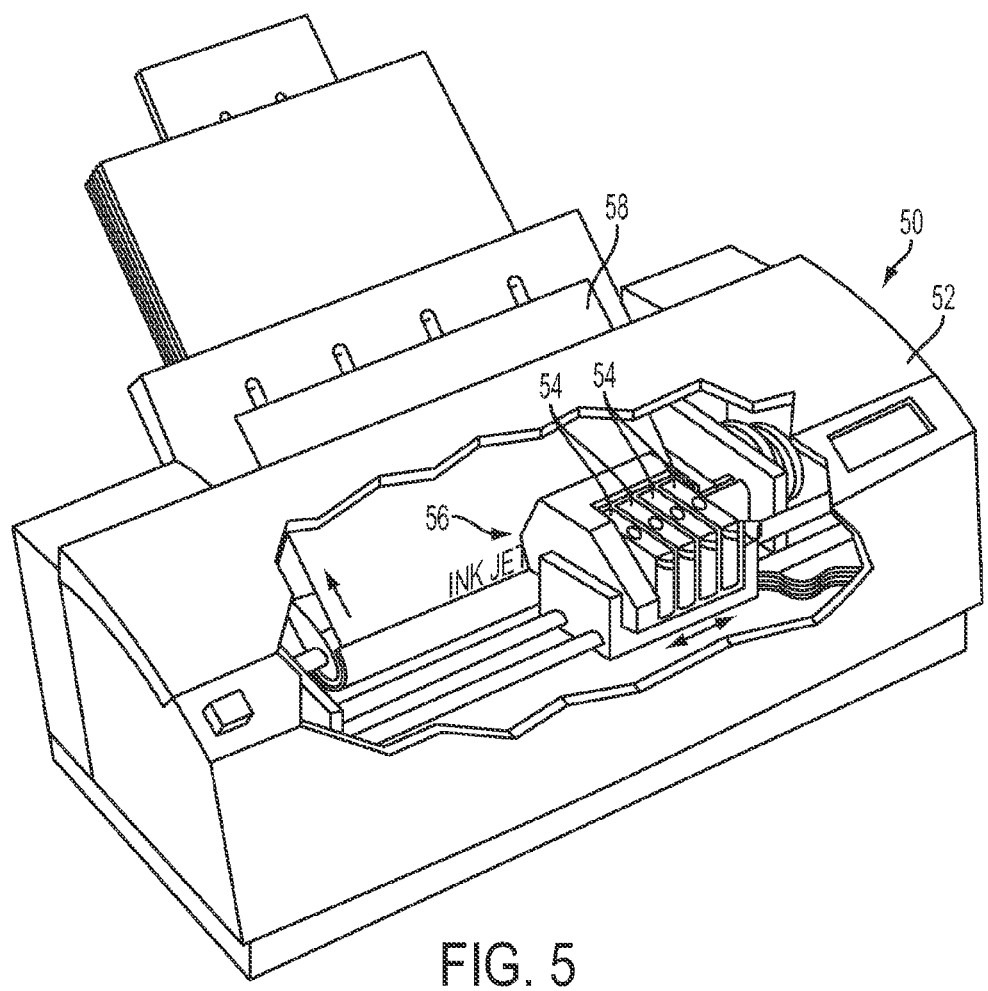
FIG. 5 is a perspective view of a printer that can be formed using one or more printheads formed using a structure and method in accordance with an embodiment of the present teachings.

FIG. 5 depicts a printer 50 including a printer housing 52 into which at least one printhead 54 formed using the methods and structures of the present teachings has been installed. During operation, ink 56 is ejected from one or more printheads 54. The printhead 54 is operated in accordance with digital instructions to create a desired image on a print medium 58 such as a paper sheet, plastic, etc. The printhead 54 may move back and forth relative to the print medium 58 in a scanning motion to generate the printed image swath by swath. Alternately, the printhead 54 may be held fixed and the print medium 58 moved relative to it, creating an image as wide as the printhead 54 in a single pass. The printhead 54 can be narrower than, or as wide as, the print medium 58. In another embodiment, the printhead 54 can print to an intermediate surface such as a rotating drum or belt (not depicted for simplicity) for subsequent transfer to a print medium.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for removing a curl from a flexible printed circuit, comprising:
   inserting a curled end of a flexible printed circuit into a cylindrical opening that is defined by a wall within a block; and
   extracting the flexible printed circuit from the cylindrical opening wherein, subsequent to extraction, the curled end of the flexible printed circuit is flattened as a result of the inserting.

2. The method of claim 1, further comprising embossing conductive contacts of the flexible printed circuit, wherein the embossing of the conductive contacts forms the curled end of the flexible printed circuit.

3. The method of claim 2, further comprising:
   inserting the curled end of the flexible printed circuit into a slot that leads into, and is integral with, the cylindrical opening; and
   extracting the flexible printed circuit from the slot wherein, subsequent to extraction from the slot, the curled end of the flexible printed circuit is flattened as a result of the inserting.

4. The method of claim 1, further comprising wrapping the flexible printed circuit around a support shaft within the cylindrical opening during the insertion of the curled end of the flexible printed circuit into the cylindrical opening.

5. The method of claim 4 wherein, during insertion of the curled end of the flexible printed circuit into the cylindrical opening, the flexible printed circuit does not physically contact the support shaft.

6. The method of claim 4 wherein, during insertion of the curled end of the flexible printed circuit into the cylindrical opening, the flexible printed circuit is prevented from buckling within the cylindrical opening through physical contact with the support shaft.

* * * * *